(12) United States Patent
Nakamura

(10) Patent No.: US 7,219,826 B2
(45) Date of Patent: May 22, 2007

(54) METHOD FOR PRODUCING METAL/CERAMIC BONDING SUBSTRATE

(75) Inventor: Junji Nakamura, Nagano (JP)

(73) Assignee: Dowa Mining Co., Ltd., Tokyo (JP)

( * ) Notice: Subject to any disclaimer, the term of this patent is extended or adjusted under 35 U.S.C. 154(b) by 127 days.

(21) Appl. No.: 10/805,768

(22) Filed: Mar. 22, 2004

(65) Prior Publication Data

US 2004/0262367 A1  Dec. 30, 2004

(30) Foreign Application Priority Data

Mar. 27, 2003 (JP) ............................. P2003-086957
Jun. 27, 2003 (JP) ............................. P2003-183844
Feb. 25, 2004 (JP) ............................. P2004-049135

(51) Int. Cl.
*B23K 31/02* (2006.01)

(52) U.S. Cl. ................................ 228/112.1; 228/124.5

(58) Field of Classification Search ............ 228/122.1, 228/124.5; 29/428, 458
See application file for complete search history.

(56) References Cited

U.S. PATENT DOCUMENTS 6,284,985 B1 * 9/2001 Naba et al. ................. 174/260
6,399,019 B1 * 6/2002 Sakuraba et al. ........... 420/501
6,613,450 B2 * 9/2003 Tsukaguchi et al. ........ 428/621
6,858,151 B2 * 2/2005 Tsukaguchi et al. .......... 216/13
6,918,529 B2 * 7/2005 Tsukaguchi et al. ..... 228/122.1

FOREIGN PATENT DOCUMENTS

JP  2594475  10/1991

\* cited by examiner

*Primary Examiner*—Jonathan Johnson
(74) *Attorney, Agent, or Firm*—Bachman & LaPointe, P.C.

(57) ABSTRACT

There is provided a method for producing a reliable metal/ceramic bonding substrate at low costs by forming a desired fillet on the peripheral portion of a metal circuit by a small number of steps. After an active metal containing brazing filler metal 12 is applied on a ceramic substrate 10 to bond a metal member 14 thereto, a resist 16 is applied on a predetermined portion of a surface of the metal member 14 to etch unnecessary portions, and then the resist is removed. Thereafter, unnecessary part of a metal layer 12b, which is formed of a metal other than an active metal of the active metal containing brazing filler metal 12, is etched with a chemical to be removed. Then, unnecessary part of an active metal layer 12a, which is formed of the active metal and a compound thereof, is selectively etched with a chemical, which inhibits the metal member 14 and the metal layer 12b from being etched and which selectively etch the active metal layer 12b, to form a metal circuit on the ceramic substrate 10. This metal circuit is chemically polished to form a fillet on the peripheral portion of the metal circuit.

21 Claims, 6 Drawing Sheets

METHOD FOR PRODUCING METAL/CERAMIC BONDING SUBSTRATE

BACKGROUND OF THE INVENTION

1. Field of the Invention

The present invention generally relates to a method for producing a metal/ceramic bonding substrate. More specifically, the invention relates to a method for producing a metal/ceramic bonding substrate wherein a metal member is bonded to a ceramic substrate via an active metal containing brazing filler metal.

2. Description of the Prior Art

In a typical metal/ceramic bonding substrate used as an insulating substrate, cracks are easily produced in a ceramic member by a thermal stress based on the difference in thermal expansion which is caused between the ceramic member and a metal member by thermal shocks after bonding. As a method for relaxing such a thermal stress, there is known a method for thinning the peripheral portion (creeping portion) of a metal member, i.e. a method for forming a stepped structure or a fillet on the peripheral portion of a metal member.

In order to realize such a structure, there is known a method for forming a fillet on the peripheral portion of a metal circuit by steps of: printing a resist on a predetermined portion of a surface of a metal plate bonded to a ceramic member via an active metal containing brazing filler metal; etching unnecessary part of the metal plate to form metal circuits, and then, removing the resist; removing unnecessary part of the brazing filler metal remaining between the metal circuits; printing a resist on the surface of the metal circuits again to etch unnecessary part of the metal circuits again; and removing the resist, i.e., by carrying out a circuit pattern printing process and a metal circuit etching process twice, respectively.

There is also known a method for forming a ceramic circuit board having a metal circuit by removing unnecessary part of a brazing filler metal with a chemical containing an inorganic acid and hydrofluoric acid after a metal circuit pattern is formed on a ceramic substrate (see, e.g., Japanese Patent No. 2594475).

However, if the fillet is formed on the peripheral portion of the metal circuit by the method for carrying out the circuit pattern printing process and the metal circuit etching process twice, respectively, producing steps are complicated, and producing costs are increased by the increase of the number of steps.

In the method disclosed in Japanese Patent No. 2594475, since an etchant containing an inorganic acid and hydrofluoric acid is used for removing unnecessary part of an active metal containing brazing filler metal, there are some cases where a layer (which will be hereinafter referred to as a "metal layer"), which is mainly formed of a metal other than an active metal of the active metal containing brazing filler metal, of two layers formed of the active metal containing brazing filler metal, i.e., the metal layer and a layer (which will be hereinafter referred to as an "active metal layer") which is mainly formed of the active metal and its compound(s), may be excessively etched (side-etched), so that there are some cases where it is difficult to form the fillet. In addition, the etchant containing the inorganic acid and hydrofluoric acid is easy to damage ceramics, so that there are some cases where reliability, such as heat cycle resistance, may be deteriorated.

SUMMARY OF THE INVENTION

It is therefore an object of the present invention to eliminate the aforementioned problems and to provide a method for producing a reliable metal/ceramic bonding substrate at low costs by forming a desired fillet on the peripheral portion of a metal circuit by a small number of steps.

In order to accomplish the aforementioned and other objects, the inventor has diligently studied and found that it is possible to form a fillet on the peripheral portion of a metal circuit by a small number of steps to produce a reliable metal/ceramic bonding substrate at low costs, by etching an active metal layer of an active metal containing brazing filler metal while inhibiting excessive etching (side etching) of a metal layer, which is formed of a metal other than the active metal of the brazing filler metal, into the metal circuit by using a chemical, which inhibits the metal circuit and the metal layer of the brazing filler metal from being etched and which selectively etch the active metal layer, when the active metal layer of the brazing filler metal is removed after a part of the metal layer is etched with a chemical. Thus, the inventor has made the present invention.

According to one aspect of the present invention, there is provided a method for producing a metal/ceramic bonding substrate wherein a metal member is bonded to at least one side of a ceramic substrate via an active metal containing brazing filler metal, the method comprising the steps of: bonding a metal member to at least one side of a ceramic substrate via an active metal containing brazing filler metal; applying a resist on a predetermined portion of a surface of the metal member to etch a part of the metal member, and then, removing the resist; etching a part of a metal layer, which is mainly formed of a metal other than an active metal of the active metal containing brazing filler metal, with a chemical; and selectively etching a part of an active metal layer, which is formed of the active metal and a compound thereof, with a chemical which inhibits the metal member and the metal layer from being etched and which selectively etch the active metal layer, to form a metal circuit on the ceramic substrate.

This method for producing a metal/ceramic bonding substrate may further comprise a step of forming a fillet on a peripheral portion of the metal circuit by chemically polishing the metal circuit after selectively etching the part of the active metal layer of the active metal containing brazing filler metal. The fillet preferably has a width of 30 μm or more. The active metal containing brazing filler metal is preferably arranged in a region which includes a metal circuit forming region for forming the metal circuit on the ceramic substrate and which is wider than the metal circuit forming region. The metal other than the active metal of the active metal containing brazing filler metal is preferably at least one kind of metal selected from the group consisting of silver, copper, nickel, tin, zinc and indium. The active metal of the active metal containing brazing filler metal is preferably at least one kind of metal selected from the group consisting of titanium, zirconium and hafnium.

In the above described method for producing a metal/ceramic bonding substrate, the chemical for selectively etching the active metal layer preferably contains a compound forming a complex with the active metal, an oxidizer and an alkali. In this case, the alkali is preferably one selected from the group consisting of ammonia, sodium hydroxide and potassium hydroxide, or a material being alkaline when it is dissolved in water. In addition, the compound forming a complex with the active metal is preferably an acidic compound. The acidic compound may be a carboxylic acid type compound. The acidic compound is preferably one selected from the group consisting of citric acid, diethylenetriaminepentaacetic acid (DTPA), ethylenediaminetetraacetic acid (EDTA), hydroxyethylethylenediaminetriacetic acid (HEDTA) 1,3-propanediaminetriacetic acid (1,3PDTA), nitrilotriacetic acid (NTA) and hydroxyethylidenediphosphoric acid (HEDT).

Alternatively, in the above described method for producing a metal/ceramic bonding substrate, the chemical for selectively etching the active metal layer may contain a compound forming a complex with the active metal, an oxidizer and an acid. In this case, the acid is preferably one selected from the group consisting of hydrochloric acid, sulfuric acid and nitric acid. In addition, the compound forming a complex with the active metal is preferably an alkaline compound. The alkaline compound may be a compound having at least one amino group in its molecule. The alkaline compound is preferably ethylenediamine.

In the above described method for producing a metal/ceramic bonding substrate, the oxidizer is preferably one selected from the group consisting of hydrogen peroxide, potassium dichromate and potassium permanganate.

In the above described method for producing a metal/ceramic bonding substrate, agitation, such as oscillation, convection of liquid, bubbling, or application of ultrasonic wave, is preferably carried out at the step of selectively etching the part of the active metal layer of the active metal containing brazing filler metal.

Moreover, in the above described method for producing a metal/ceramic bonding substrate, all or part of a surface of the metal circuit is preferably plated with nickel or a nickel alloy.

According to the present invention, it is possible to form a desired fillet while preventing side etching and while decreasing damage to a ceramic, by using an etchant, which is capable of inhibiting etching of a metal layer while selectively removing only an active metal layer, if only a copper circuit printing step and a copper circuit etching step are carried out once, respectively. Thus, it is possible to provide a reliable metal/ceramic bonding substrate at low costs

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a method for producing a metal/ceramic bonding substrate according to the present invention will be described below.

Figure 1A:
FIGS. 1A through 1C are sectional views showing steps of a method for producing a metal/ceramic bonding substrate according to the present invention.
Figure 1B:
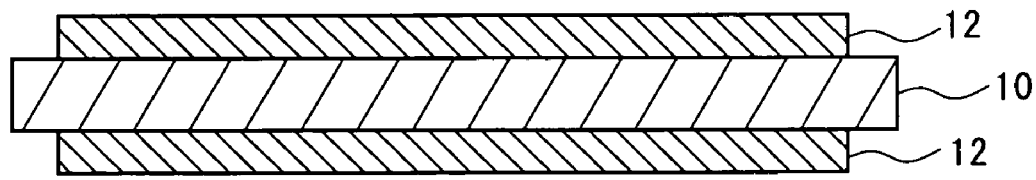
Figure 1C:
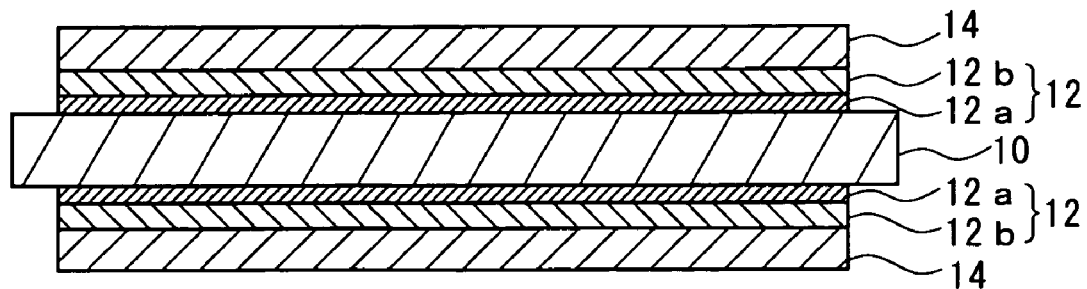

As shown in FIGS. 1A through 1C, a ceramic substrate 10 is prepared (FIG. 1A), and a paste-like active metal containing brazing filler metal 12 is printed on both sides of the ceramic substrate 10 by screen printing (FIG. 1B). Then, a metal member 14 is arranged on the brazing filler metal 12 on both sides of the ceramic substrate 10 to be heated in substantially vacuum or non-oxidizing atmosphere. Thereafter, they are cooled to bond the metal member 14 to both sides of the ceramic substrate 10. By this bonding, the active metal containing brazing filler metal 12 forms a layer (active metal layer) 12a, which is mainly formed of an active metal of the active metal containing brazing filler metal and its compound(s), and a layer (metal layer) 12b which is mainly formed of a metal other than the active metal of the active metal containing brazing filler metal (FIG. 1C). However, the layers 12a and 12b are not always layers which are clearly separated as shown in the figure. There are some cases where the boundary between the layers 12a and 12b may be clearly observed to some extent, or there are some cases where the layers 12a and 12b may be apparently observed as a single layer in accordance with the kind and thickness of the brazing filler metal and other conditions. However, even if the layers 12a and 12b are apparently observed as a single layer, a reaction product, which is produced by a reaction of the active metal with the ceramic and which contributes bonding, always exists. For convenience, it is assumed that such a reaction product is included in the active metal layer 12a. The active metal containing brazing filler metal 12 may be a foil or a film formed by sputtering.

As the ceramic substrate 10, a substrate of an oxide mainly containing alumina or silica, or a non-oxide mainly containing aluminum nitride or silicon nitride or silicon carbonate, having a size of about 5 to 200 mm×5 to 200 mm×0.25 to 3.0 mm, may be used. At the active metal component of the active metal containing brazing filler metal 12, at least one of titanium, zirconium, hafnium and their hydrides may be used. As the metal member 14, a metal foil or plate of a simple metal, such as copper, aluminum or nickel, a copper alloy, such as manganin or brass, or an alloy, such as stainless, having a thickness of 0.1 to 0.5 mm, may be used.

Figure 2A:
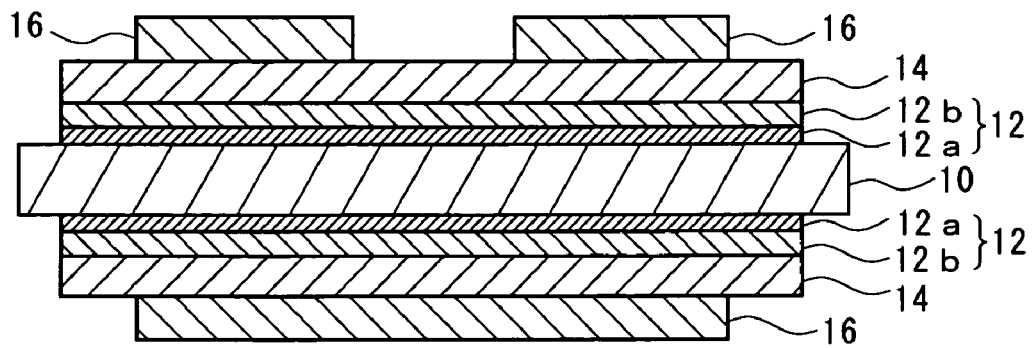
FIGS. 2A through 2C are sectional views showing steps of a method for producing a metal/ceramic bonding substrate according to the present invention.
Figure 2B:
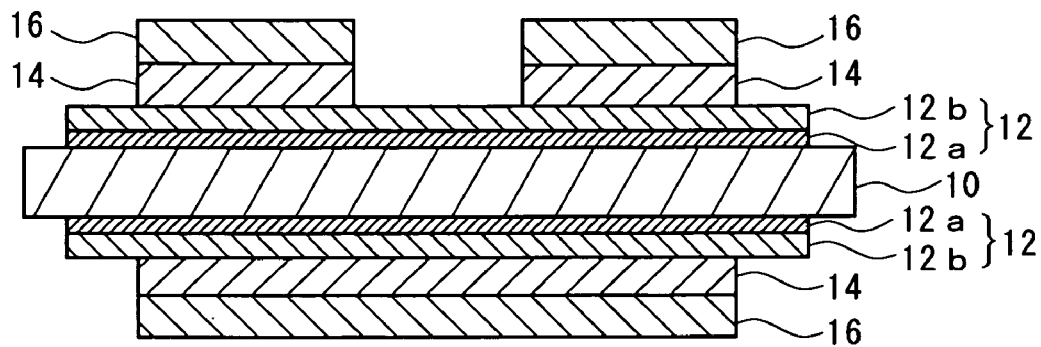
Figure 2C:
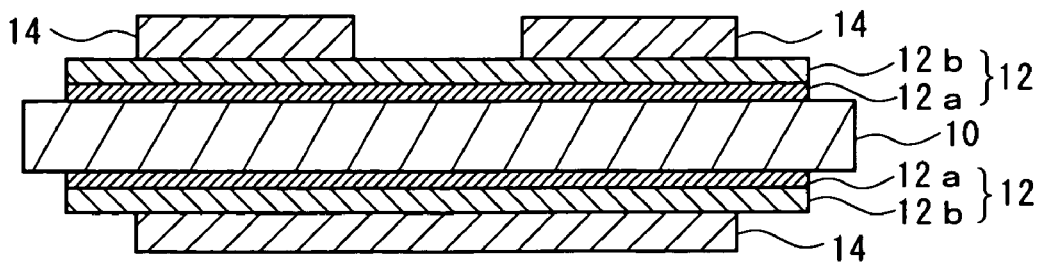
Figure 3A:
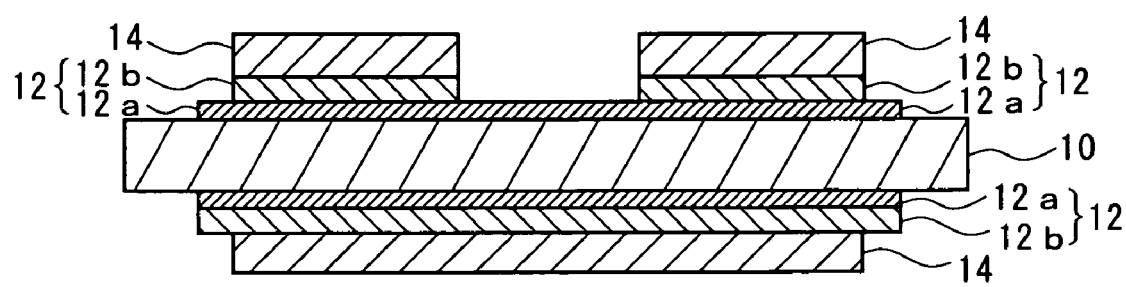
FIGS. 3A and 3B are sectional views showing steps of a method for producing a metal/ceramic bonding substrate according to the present invention.
Figure 3B:
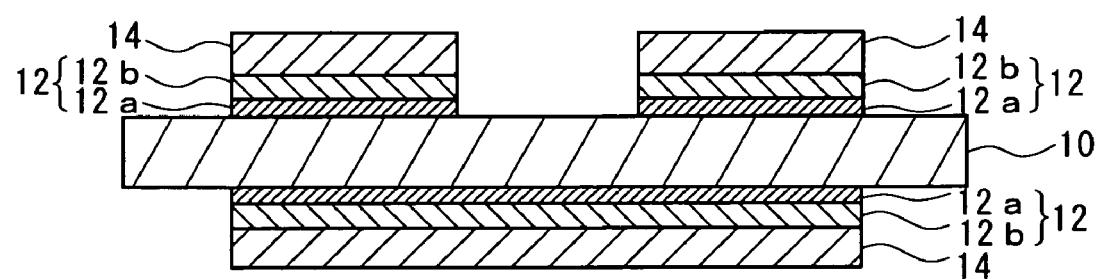

Then, as shown in FIGS. 2A through 2C, a resist 16 having a desired circuit pattern is printed on the bonded metal member 14 on both sides (FIG. 2A), and unnecessary part of the metal member 14 is etched and removed with an etchant of cupric chloride or iron chloride (FIG. 2B) to remove the resist 16 (FIG. 2C). Furthermore, the resist 16 may be formed by another method, such as dry film.

Figure 4A:
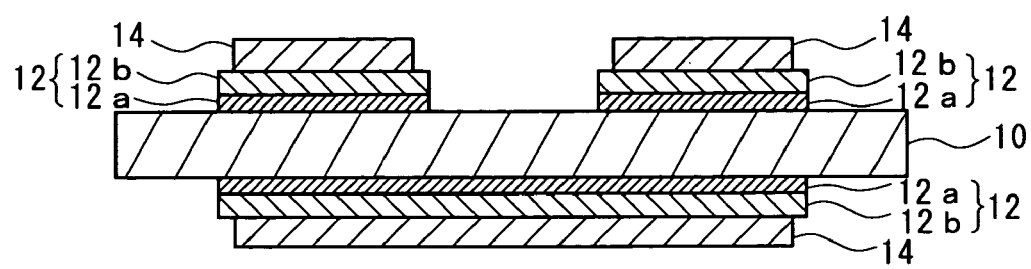
FIGS. 4A and 4B are sectional views showing steps of a method for producing a metal/ceramic bonding substrate according to the present invention.
Figure 4B:
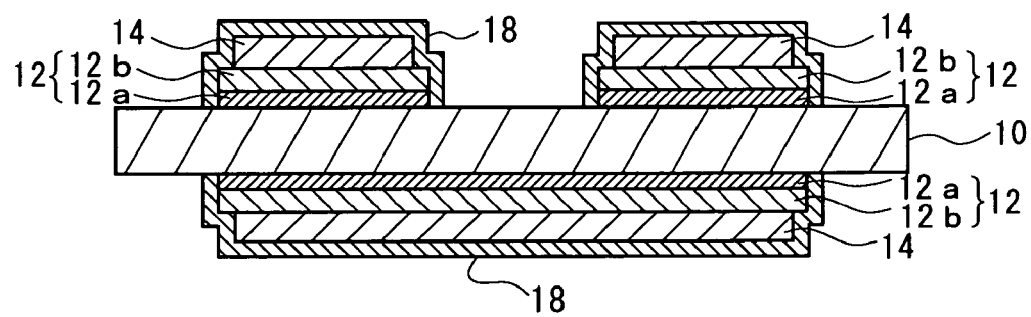
Figure 5:
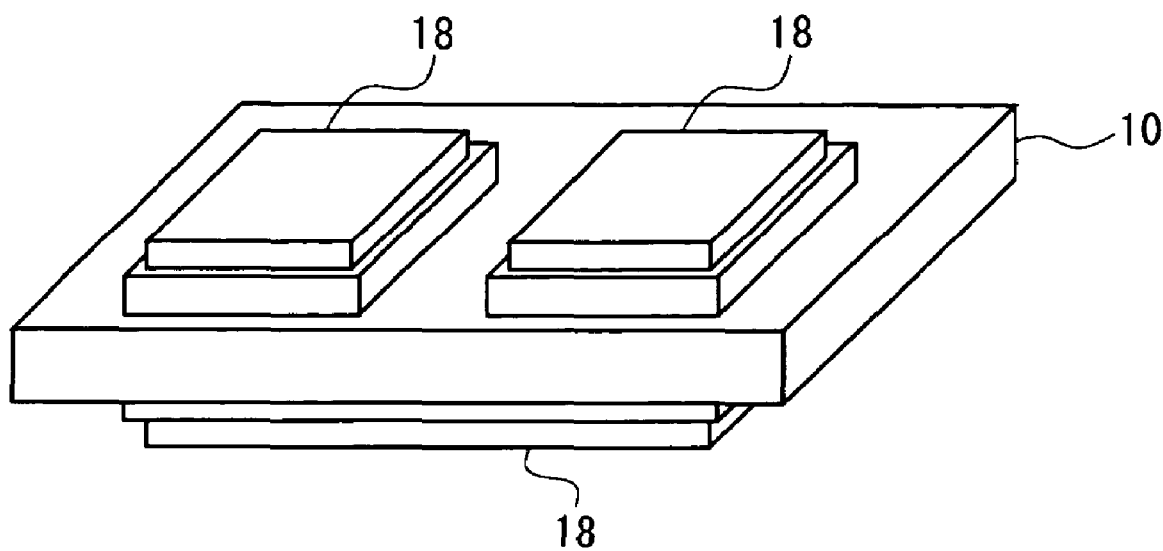
FIG. 5 is a perspective view of a metal/ceramic bonding substrate produced by a method for producing a metal/ceramic bonding substrate according to the present invention.
Figure 6:
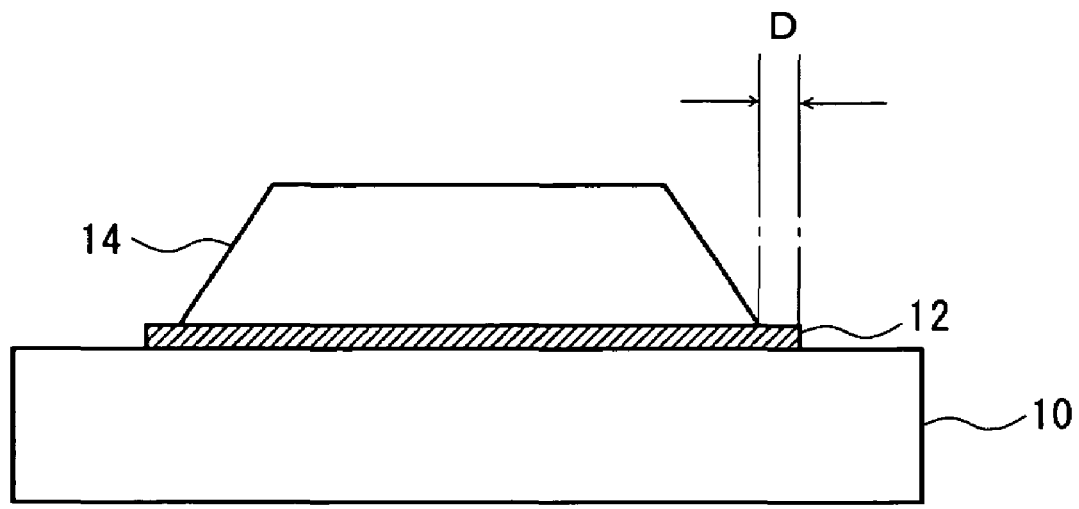
FIG. 6 is an illustration for explaining a fillet width of a metal/ceramic bonding substrate.

Then, as shown in FIGS. 3A through 5, after unnecessary part of the metal layer 12b between metal circuits is removed with a solution containing, e.g., 3% of EDTA (ethylenediaminetetraacetic acid) (FIG. 3A), unnecessary part of the active metal layer 12a between metal circuits is removed with a chemical (FIG. 3B), and chemical polishing is carried out (FIG. 4A). Thereafter, plating 18 is carried out to obtain a metal/ceramic bonding substrate having a fillet having a predetermined width (FIGS. 4B and 5). The width of the fillet can be flexibly controlled to be in the range of, e.g., from 0 to 250 μm, by changing the chemical polishing solution and processing time. Throughout the specification, the width of the fillet means a length shown by D in FIG. 6. Furthermore, although the sides of the metal member are shown to be perpendicular to the ceramic substrate in FIGS. 1C through 4B, the sides of the metal member are obliquely shown in FIG. 6. These figures are schematically shown, and the sides of the metal member are etched in fact, so that the sides of the metal member are often inclined as shown in the figures or have a circular shape.

The chemical used for removing the unnecessary part of the active metal layer 12a may be a chemical containing: a carboxylic acid type compound forming a complex with an active metal, such as titanium, zirconium or hafnium, or a compound having at least one amino group in its molecule; an oxidizer, such as hydrogen peroxide, potassium dichromate or potassium permanganate; and an acid or alkali to be added for causing the complex to be water soluble. The acid or alkali may be selected in accordance with the compound forming the complex with the active metal. In the case of an acidic compound, such as a carboxylic acid type compound, an alkali, such as ammonia, sodium hydroxide or potassium hydroxide, is used. In this case, pH of the chemical is preferably in the range of from 7 to 10, and more preferably in the range of from 8.5 to 9.5. If pH exceeds 10, the solution is decomposed, and if pH is lower than 7, it is difficult to dissolve the acidic compound. In the case of an alkaline compound, such as an amine compound, an acid, such as hydrochloric acid, sulfuric acid or nitric acid, is used.

Examples of a method for producing a metal/ceramic bonding substrate according to the present invention will be described below in detail.

EXAMPLE 1

An active metal containing brazing filler metal (Ag:Cu:Ti=80:17:3) containing 3 wt % of titanium as an active metal component was printed, by screen printing, on both sides of an aluminum nitride substrate having a size of 45 mm×45 mm×0.635 mm. Then, a copper plate having a thickness of 0.3 mm was arranged thereon on both sides of the aluminum nitride substrate to be heated at 850° C. in vacuum to be bonded to both sides of the aluminum nitride substrate.

Then, after a resist having a predetermined circuit pattern was printed on the copper plate on both sides, unnecessary part of the copper plate was etched with an etchant of cupric chloride, and the resist was removed with a 3% NaOH solution to form a copper circuit.

Thereafter, unnecessary part of a metal layer (a layer of a metal other than the active metal of the active metal containing brazing filler metal) and a part of unnecessary part of the active metal layer mainly containing titanium nitride, which had remained between copper circuits and on the end portion of the aluminum nitride substrate, were etched and removed at 20° C. for 15 minutes with a solution containing 5% of hydrogen peroxide, 3% of aqueous ammonia and 1.6 wt % of EDTA. After this etching, the substrate was observed with naked eyes. As a result, there was no gap between the copper circuit and the aluminum nitride substrate, and no side etch was confirmed.

Then, unnecessary part of the active metal layer mainly containing titanium nitride between copper circuits was selectively etched and removed at 30° C. for 30 minutes with a chemical containing 5% of citric acid, 10% of hydrogen peroxide and 4.5% of potassium hydroxide.

Then, after the copper circuit was processed at 45° C. for 5 minutes with a polishing solution containing sulfuric acid and hydrogen peroxide to be chemically polished, a plating having a thickness of 2.5 μm was applied thereon to produce a metal/ceramic bonding substrate.

On a cross section of the substrate thud obtained, it was observed that a fillet having a width of about 50 μm was formed.

With respect to the substrate thus obtained, after a heat cycle (20° C.→−40° C.×30 minutes→20° C.×10 minutes→125° C.×30 minutes→20° C.×10 minutes) was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

COMPARATIVE EXAMPLE 1

An active metal containing brazing filler metal (Ag:Cu:Ti=80:17:3) containing 3 wt % of titanium as an active metal component was printed, by screen printing, on both sides of an aluminum nitride substrate having a size of 45 mm×45 mm×0.635 mm. Then, a copper plate having a thickness of 0.3 mm was arranged thereon on both sides of the aluminum nitride substrate to be heated at 850° C. in vacuum to be bonded to both sides of the aluminum nitride substrate.

Then, after a resist having a predetermined circuit pattern was printed on the copper plate on both sides, unnecessary part of the copper plate was etched with an etchant of cupric chloride, and the resist was removed with a 3% NaOH solution to form a copper circuit.

Thereafter, unnecessary part of the brazing filler metal remaining between copper circuits and on the end portion of the aluminum nitride substrate was processed at 35° C. for 20 minutes with a mixed acid of sulfuric acid, hydrofluoric acid and hydrogen peroxide, to be removed. After this processing, the substrate was observed with naked eyes. As a result, it was observed that there was a gap between the copper circuit and the aluminum nitride substrate.

Then, after the copper circuit was processed at 45° C. for 5 minutes with a polishing solution containing sulfuric acid and hydrogen peroxide to be chemically polished, a plating having a thickness of 2.5 μm was applied thereon to produce a metal/ceramic bonding substrate.

Figure 7:
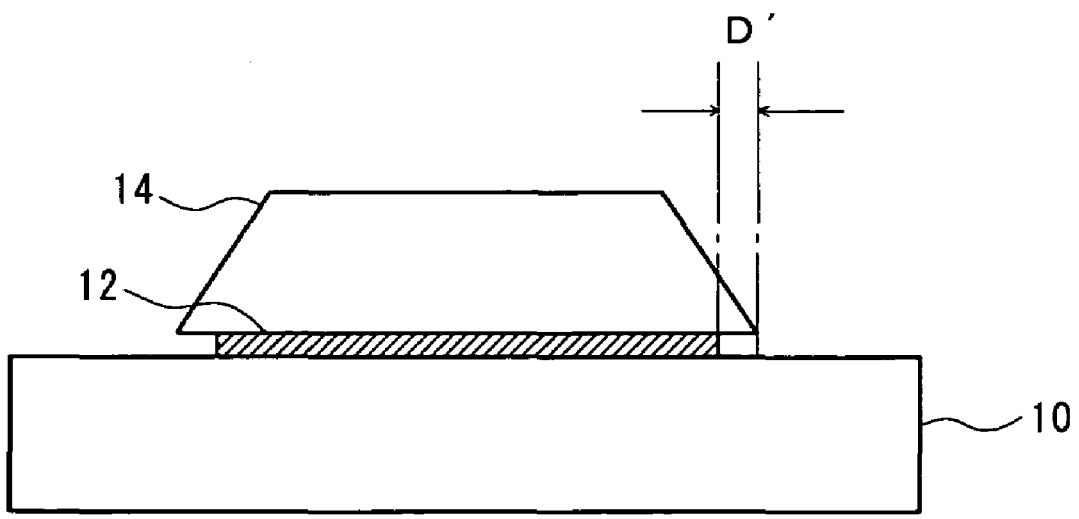
FIG. 7 is an illustration for explaining a side etch amount of a metal/ceramic bonding substrate.

On a cross section of the substrate thud obtained, it was observed that no fillet was formed and that the metal layer was side-etched as schematically shown in FIG. 7 (in FIG. 7, D' denotes a side etch amount) to form a gap having a size of about 30 μm between the aluminum nitride substrate and the copper circuit. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, cracks capable of being observed with naked eyes were produced in the aluminum nitride substrate.

EXAMPLE 2

A copper plates having a thickness of 0.25 mm was bonded to both sides of an aluminum nitride substrate having a size of 50 mm×30 mm×0.635 mm via an active metal containing brazing filler metal (Ag:Cu:Ti=80:17:3) containing 3 wt % of titanium as an active metal component, by heating them at 850° C. under a pressure of $10^{-5}$ torr or less.

Then, after a resist having a predetermined circuit pattern was printed on the copper plate on both sides, unnecessary part of the copper plate was etched with an etchant of cupric chloride, and the resist was removed with a 3% NaOH solution to form a copper circuit.

Thereafter, unnecessary part of a metal layer (a layer of a metal other than an active metal of the active metal containing brazing filler metal) and a part of unnecessary part of the active metal layer mainly containing titanium nitride, which had remained between copper circuits and on the end portion of the aluminum nitride substrate, were etched and removed at 20° C. for 15 minutes with a solution containing 5% of hydrogen peroxide, 3% of aqueous ammonia and 1.6 wt % of EDTA. After this etching, the substrate was observed with naked eyes. As a result, there was no gap between the copper circuit and the aluminum nitride substrate, and no side etch was confirmed.

Then, unnecessary part of the active metal layer mainly containing titanium nitride between copper circuits were selectively etched and removed at 30° C. for 30 minutes with a chemical containing 2% of DTPA·5Na and 5% of hydrogen peroxide.

Then, after the copper circuit was processed at 45° C. for 5 minutes with a polishing solution containing sulfuric acid and hydrogen peroxide to be chemically polished, an electroless nickel plating having a thickness of 3 μm was applied thereon to produce a metal/ceramic bonding substrate.

On a cross section of the substrate thud obtained, it was observed that a fillet having a width of about 50 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

COMPARATIVE EXAMPLE 2

A copper plates having a thickness of 0.25 mm was bonded to both sides of an aluminum nitride substrate having a size of 50 mm×30 mm×0.635 mm via an active metal containing brazing filler metal (Ag:Cu:Ti=80:17:3) containing 3 wt % of titanium as an active metal component, by heating them at 850° C. under a pressure of $10^{-5}$ torr or less.

Then, after a resist having a predetermined circuit pattern was printed on the copper plate on both sides, unnecessary part of the copper plate was etched with an etchant of cupric chloride, and the resist was removed with a 3% NaOH solution to form a copper circuit.

Thereafter, unnecessary part of the brazing filler metal remaining between copper circuits and on the end portion of the aluminum nitride substrate was etched and removed at 35° C. for 20 minutes with a mixed acid of sulfuric acid, hydrofluoric acid and hydrogen peroxide. After this etching, the substrate was observed with naked eyes. As a result, it was observed that there was a gap between the copper circuit and the aluminum nitride substrate.

Then, after the copper circuit was chemically polished with a polishing solution containing sulfuric acid and hydrogen peroxide, an electroless nickel plating having a thickness of 3 μm was applied thereon to produce a metal/ceramic bonding substrate.

On a cross section of the substrate thud obtained, it was observed that no fillet was formed and that the metal layer was side-etched to form a gap having a size of about 30 μm between the aluminum nitride substrate and the copper circuit. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, cracks were produced in the aluminum nitride substrate.

EXAMPLE 3

A metal/ceramic bonding substrate was produced by the same method as that in Example 1, except that an active metal containing brazing filler metal (Ag:Cu:Hf=80:17:3) containing 3 wt % of hafnium as an active metal component was used, that a chemical containing 3% of ethylenediamine, 5% of potassium permanganate and 3.8% of hydrochloric acid was used as an etchant for selectively etching unnecessary part of an active metal layer, and that the chemical polishing time was 4 minutes. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 40 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

COMPARATIVE EXAMPLE 3

A metal/ceramic bonding substrate was produced by the same method as that in Comparative Example 2, except that an active metal containing brazing filler metal (Ag:Cu:Hf=80:17:3) containing 3 wt % of hafnium as an active metal component was used. In this comparative example, after the brazing filler metal was removed, the substrate was observed with naked eyes. As a result, it was observed that there was a gap between the copper circuit and the aluminum nitride substrate.

On a cross section of the substrate thud obtained, it was observed that no fillet was formed and that the metal layer was side-etched to form a gap having a size of about 30 μm between the aluminum nitride substrate and the copper circuit. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, cracks were produced in the aluminum nitride substrate.

EXAMPLE 4

A metal/ceramic bonding substrate was produced by the same method as that in Example 1, except that an alumina substrate was used, that an active metal containing brazing filler metal (Ag:Cu:Sn:ZrH$_2$=80:12:5:3) containing 3 wt % of ZrH$_2$ as an active metal component was used, that a chemical containing 3% of EDTA·4Na and 4% of potassium dichromate was used as an etchant for selectively etching unnecessary part of an active metal layer, and that the chemical polishing time was 4 minutes. In this example, after unnecessary part of a metal layer (a layer of a metal other than the active metal of the active metal containing brazing filler metal) and a part of unnecessary part of the active metal layer, which had remained between copper circuits and on the end portion of the alumina substrate, were removed by etching, the substrate was observed with naked eyes. As a result, there was no gap between the copper circuit and the alumina substrate, and no side etch was confirmed.

On a cross section of the substrate thud obtained, it was observed that a fillet having a width of about 40 µm was formed. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, no crack was produced in the alumina substrate, so that the advantageous effects of the fillet enhancing reliability with respect to repeated heat cycles were confirmed.

COMPARATIVE EXAMPLE 4

A metal/ceramic bonding substrate was produced by the same method as that in Comparative Example 1, except that an alumina substrate was used and that an active metal containing brazing filler metal (Ag:Cu:Sn:ZrH$_2$=80:12:5:3) containing 3 wt % of ZrH$_2$ as an active metal component was used. In this comparative example, after the brazing filler metal was removed, the substrate was observed with naked eyes. As a result, it was observed that there was a gap between the copper circuit and the alumina substrate.

On a cross section of the substrate thud obtained, it was observed that no fillet was formed and that the metal layer was side-etched to form a gap having a size of about 30 µm between the alumina substrate and the copper circuit. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, cracks were produced in the alumina substrate.

EXAMPLE 5

A metal/ceramic bonding substrate was produced by the same method as that in Example 1, except that an alumina substrate was used, that an active metal containing brazing filler metal (Ag:Cu:Ni:Ti=75:15:7:3) containing 3 wt % of titanium as an active metal component was used, that a chemical containing 2% of HEDTA·3Na and 5% of hydrogen peroxide was used as an etchant for selectively etching unnecessary part of an active metal layer, and that the chemical polishing time was 5 minutes and 30 seconds. In this example, after unnecessary part of a metal layer (a layer of a metal other than the active metal of the active metal containing brazing filler metal) and a part of unnecessary part of the active metal layer, which had remained between copper circuits and on the end portion of the alumina substrate, were removed by etching, the substrate was observed with naked eyes. As a result, there was no gap between the copper circuit and the alumina substrate, and no side etch was confirmed.

On a cross section of the substrate thud obtained, it was observed that a fillet having a width of about 55 µm was formed. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, no crack was produced in the alumina substrate, so that the advantageous effects of the fillet enhancing reliability with respect to repeated heat cycles were confirmed.

COMPARATIVE EXAMPLE 5

A metal/ceramic bonding substrate was produced by the same method as that in Comparative Example 2, except that an alumina substrate was used and that an active metal containing brazing filler metal (Ag:Cu:Ni:Ti=75:15:7:3) containing 3 wt % of titanium as an active metal component was used. In this comparative example, after the brazing filler metal was removed, the substrate was observed with naked eyes. As a result, it was observed that there was a gap between the copper circuit and the alumina substrate.

On a cross section of the substrate thud obtained, it was observed that no fillet was formed and that the metal layer was side-etched to form a gap having a size of about 30 µm between the alumina substrate and the copper circuit. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, cracks were produced in the alumina substrate.

EXAMPLE 6

A metal/ceramic bonding substrate was produced by the same method as that in Example 1, except that an alumina substrate was used, that an active metal containing brazing filler metal (Ag:Cu:In:Zn:Ti=70:15:7:5:3) containing 3 wt % of titanium as an active metal component was used, and that a chemical containing 3% of 3PDTA, 7% of hydrogen peroxide and 1.8% of sodium hydroxide was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the alumina substrate, were removed by etching, the substrate was observed with naked eyes. As a result, there was no gap between the copper circuit and the alumina substrate, and no side etch was confirmed.

On a cross section of the substrate thud obtained, it was observed that a fillet having a width of about 50 μm was formed. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, no crack was produced in the alumina substrate, so that the advantageous effects of the fillet enhancing reliability with respect to repeated heat cycles were confirmed.

COMPARATIVE EXAMPLE 6

A metal/ceramic bonding substrate was produced by the same method as that in Comparative Example 2, except that an alumina substrate was used and that an active metal containing brazing filler metal (Ag:Cu:In:Zn:Ti=70:15:7:5:3) containing 3 wt % of titanium as an active metal component was used. In this comparative example, after the brazing filler metal was removed, the substrate was observed with naked eyes. As a result, it was observed that there was a gap between the copper circuit and the alumina substrate.

On a cross section of the substrate thud obtained, it was observed that no fillet was formed and that the metal layer was side-etched to form a gap having a size of about 30 μm between the alumina substrate and the copper circuit. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, cracks were produced in the alumina substrate.

EXAMPLE 7

A metal/ceramic bonding substrate was produced by the same method as that in Example 1, except that an active metal containing brazing filler metal (Ag:Cu:Ti=90:8.5:1.5) containing 1.5 wt % of titanium as an active metal component was used, that a chemical containing 2% of citric acid, 9% of hydrogen peroxide and 1.8% of potassium hydroxide was used as an etchant for selectively etching unnecessary part of an active metal layer at 37° C. for 60 minutes, and that the chemical polishing time was 4 minutes. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 40 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

EXAMPLE 8

A metal/ceramic bonding substrate was produced by the same method as that in Example 7, except that a chemical containing 1.8% of DTPA·5Na and 6% of hydrogen peroxide was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 35 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

EXAMPLE 9

A metal/ceramic bonding substrate was produced by the same method as that in Example 7, except that an active metal containing brazing filler metal (Ag:Cu:Hf=81.5:17:1.5) containing 1.5 wt % of hafnium as an active metal component was used and that a chemical containing 1.5% of ethylenediamine, 5% of potassium permanganate and 2% of hydrochloric acid was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 40 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

EXAMPLE 10

A metal/ceramic bonding substrate was produced by the same method as that in Example 7, except that an alumina substrate was used, that an active metal containing brazing filler metal (Ag:Cu:Sn:ZrH$_2$=81.5:12:5:1.5) containing 1.5 wt % of ZrH$_2$ as an active metal component was used and that a chemical containing 2% of EDTA·4Na and 4% of potassium dichromate was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the alumina substrate, were removed by etching, the substrate was observed with naked eyes. As a result, there was no gap between the copper circuit and the alumina substrate, and no side etch was confirmed.

On a cross section of the substrate thud obtained, it was observed that a fillet having a width of about 40 μm was formed. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, no crack was produced in the alumina substrate, so that the advantageous effects of the fillet enhancing reliability with respect to repeated heat cycles were confirmed.

EXAMPLE 11

A metal/ceramic bonding substrate was produced by the same method as that in Example 7, except that an alumina substrate was used, that an active metal containing brazing filler metal (Ag:Cu:Ni:Ti=76.5:15:7:1.5) containing 1.5 wt % of titanium as an active metal component was used, that a chemical containing 2% of NTA·3Na and 5% of hydrogen peroxide was used as an etchant for selectively etching unnecessary part of an active metal layer, and that the chemical polishing time was 5 minutes. In this example, after unnecessary part of a metal layer (a layer of a metal other than the active metal of the active metal containing brazing filler metal) and a part of unnecessary part of the active metal layer, which had remained between copper circuits and on the end portion of the alumina substrate, were removed by etching, the substrate was observed with naked eyes. As a result, there was no gap between the copper circuit and the alumina substrate, and no side etch was confirmed.

On a cross section of the substrate thud obtained, it was observed that a fillet having a width of about 45 μm was formed. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, no crack was produced in the alumina substrate, so that the advantageous effects of the fillet enhancing reliability with respect to repeated heat cycles were confirmed.

EXAMPLE 12

A metal/ceramic bonding substrate was produced by the same method as that in Example 7, except that an alumina substrate was used, that an active metal containing brazing filler metal (Ag:Cu:In:Zn:Ti=71.5:15:7:5:1.5) containing 1.5 wt % of titanium as an active metal component was used, that a chemical containing 1.5% of 3PDTA, 7% of hydrogen peroxide and 1.0% of sodium hydroxide was used as an etchant for selectively etching unnecessary part of an active metal layer, and that the chemical polishing time was 5 minutes. In this example, after unnecessary part of a metal layer (a layer of a metal other than the active metal of the active metal containing brazing filler metal) and a part of unnecessary part of the active metal layer, which had remained between copper circuits and on the end portion of the alumina substrate, were removed by etching, the substrate was observed with naked eyes. As a result, there was no gap between the copper circuit and the alumina substrate, and no side etch was confirmed.

On a cross section of the substrate thud obtained, it was observed that a fillet having a width of about 50 μm was formed. With respect to the substrate thus obtained, after the same heat cycle as that in Example 1 was repeatedly carried out three hundreds times, the copper circuit and the brazing filler metal were removed to observe the surface of the alumina substrate by an optical microscope. At a result, no crack was produced in the alumina substrate, so that the advantageous effects of the fillet enhancing reliability with respect to repeated heat cycles were confirmed.

EXAMPLE 13

A metal/ceramic bonding substrate was produced by the same method as that in Example 7, except that a chemical containing 1.8% of HEDTA·3Na and 8% of hydrogen peroxide was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 35 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

EXAMPLE 14

A metal/ceramic bonding substrate was produced by the same method as that in Example 7, except that a chemical containing 1.8% of HEDP·4Na and 8% of hydrogen peroxide was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 35 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

EXAMPLE 15

A metal/ceramic bonding substrate was produced by the same method as that in Example 7, except that a chemical containing 2% of DTPA·5Na and 7% of hydrogen peroxide was used as an etchant for selectively etching unnecessary part of an active metal layer. In this example, after unnecessary part of a metal layer (a layer of a metal other than the active metal of the active metal containing brazing filler metal) and a part of unnecessary part of the active metal layer, which had remained between copper circuits and on the end portion of the aluminum nitride substrate, were removed by etching, the substrate was observed with naked eyes. As a result, there was no gap between the copper circuit and the aluminum nitride substrate, and no side etch was confirmed.

On a cross section of the substrate thud obtained, it was observed that a fillet having a width of about 35 μm was formed. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, no crack was produced in the aluminum nitride substrate, so that the advantageous effects of the fillet enhancing reliability with respect to repeated heat cycles were confirmed.

COMPARATIVE EXAMPLE 7

A metal/ceramic bonding substrate was produced by the same method as that in Comparative Example 2, except that unnecessary part of the brazing filler metal remaining between copper circuits and on the end portion of the aluminum nitride substrate was etched and removed at 20° C. for 45 minutes with a solution containing 5% of hydrogen peroxide, 3% of aqueous ammonia and 1.6 wt % of EDTA. In this comparative example, after the brazing filler metal was removed, the substrate was observed with naked eyes. As a result, it was observed that there was a gap between the copper circuit and the aluminum nitride substrate.

On a cross section of the substrate thud obtained, it was observed that no fillet was formed and that the metal layer was side-etched to form a gap having a size of about 50 μm between the aluminum nitride substrate and the copper circuit. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, cracks were produced in the aluminum nitride substrate.

COMPARATIVE EXAMPLE 8

A metal/ceramic bonding substrate was produced by the same method as that in Comparative Example 7, except that an active metal containing brazing filler metal (Ag:Cu:Hf=80:17:3) containing 3 wt % of hafnium as an active metal component was used. In this comparative example, after the brazing filler metal was removed, the substrate was observed with naked eyes. As a result, it was observed that there was a gap between the copper circuit and the aluminum nitride substrate.

On a cross section of the substrate thud obtained, it was observed that no fillet was formed and that the metal layer was side-etched to form a gap having a size of about 70 μm between the aluminum nitride substrate and the copper circuit. With respect to the substrate thus obtained, after the same heat cycle as that in Example 1 was repeatedly carried out three hundreds times, the copper circuit and the brazing filler metal were removed to observe the surface of the aluminum nitride substrate by an optical microscope. At a result, cracks were produced in the aluminum nitride substrate.

The results in Examples 1 through 15 and Comparative Examples 1 through 8 are shown in Tables 1 through 5.

TABLE 1

| Ex. | Ceramic | Metal Plate | Brazing Filler Metal | Chemicals (30° C. × 30 min.) | Width of Fillet | 300 Heat Cycles |
|---|---|---|---|---|---|---|
| 1 | AlN | copper | Ag/Cu/Ti = 80/17/3 | citric acid (5%)/ hydrogen peroxide (10%)/ potassium hydroxide (4.5%) | 50 μm | No Crack |
| 2 | AlN | copper | Ag/Cu/Ti = 80/17/3 | DTPA•5Na (2%)/ hydrogen peroxide (5%) | 50 μm | No Crack |
| 3 | AlN | copper | Ag/Cu/Hf = 80/17/3 | ethylenediamine (3%)/potassium permanganate (5%)/ hydrochloric acid (3.8%) | 40 μm | No Crack |
| 4 | alumina | copper | Ag/Cu/Sn/ZrH$_2$ = 80/12/5/3 | EDTA•4Na (3%)/ potassium dichromate (4%) | 40 μm | No Crack |
| 5 | alumina | copper | Ag/Cu/Ni/Ti = 75/15/7/3 | HEDTA•3Na (2%)/ hydrogen peroxide (5%) | 55 μm | No Crack |

TABLE 1-continued

| Ex. | Ceramic | Metal Plate | Brazing Filler Metal | Chemicals (30° C. × 30 min.) | Width of Fillet | 300 Heat Cycles |
|---|---|---|---|---|---|---|
| 6 | alumina | copper | Ag/Cu/In/Zn/Ti = 70/15/7/5/3 | 3PDTA (3%)/ hydrogen peroxide (7%)/ sodium hydroxide (1.8%) | 50 μm | No Crack |

TABLE 2

| Ex. | Ceramic | Metal Plate | Brazing Filler Metal | Chemicals (37° C. × 60 min.) | Width of Fillet | 300 Heat Cycles |
|---|---|---|---|---|---|---|
| 7 | AlN | copper | Ag/Cu/Ti = 90/8.5/1.5 | citric acid (2%)/ hydrogen peroxide (9%)/ potassium hydroxide (1.8%) | 40 μm | No Crack |
| 8 | AlN | copper | Ag/Cu/Ti = 90/8.5/1.5 | DTPA•5Na (1.8%)/ hydrogen peroxide (6%) | 35 μm | No Crack |
| 9 | AlN | copper | Ag/Cu/Hf = 81.5/17/1.5 | ethylenediamine (1.5%)/ potassium permanganate (5%)/ hydrochloric acid (2%) | 40 μm | No Crack |
| 10 | alumina | copper | Ag/Cu/Sn/ZrH$_2$ = 81.5/12/5/1.5 | EDTA•4Na(2%)/ potassium dichromate (4%) | 40 μm | No Crack |
| 11 | alumina | copper | Ag/Cu/Ni/Ti = 76.5/15/7/1.5 | NTA•3Na (2%)/ hydrogen peroxide(5%) | 45 μm | No Crack |
| 12 | alumina | copper | Ag/Cu/In/Zn/Ti = 71.5/15/7/5/1.5 | 3PDTA (1.5%)/ hydrogen peroxide (7%)/ sodium hydroxide (1.0%) | 50 μm | No Crack |

TABLE 3

| Ex. | Ceramic | Metal Plate | Brazing Filler Metal | Chemicals (37° C. × 60 min.) | Width of Fillet | 300 Heat Cycles |
|---|---|---|---|---|---|---|
| 13 | AlN | copper | Ag/Cu/Ti = 90/8.5/1.5 | HEDTA•3Na (1.8%)/ hydrogen peroxide (8%) | 35 μm | No Crack |
| 14 | AlN | copper | Ag/Cu/Ti = 90/8.5/1.5 | HEDP•4Na (1.8%)/ hydrogen peroxide (8%) | 35 μm | No Crack |
| 15 | AlN | copper | Ag/Cu/Ti = 90/8.5/1.5 | DTPA•5Na (2%)/ hydrogen peroxide (7%) | 35 μm | No Crack |

TABLE 4

| Comp. | Ceramic | Metal Plate | Brazing Filler Metal | Chemicals (35° C. × 20 min.) | Side Etch Amount | 300 Heat Cycles |
|---|---|---|---|---|---|---|
| 1 | AlN | copper | Ag/Cu/Ti = 80/17/3 | sulfuric acid- hydrofluoric acid- hydrogen peroxide | 30 μm | Cracks |

TABLE 4-continued

| Comp. | Ceramic | Metal Plate | Brazing Filler Metal | Chemicals (35° C. × 20 min.) | Side Etch Amount | 300 Heat Cycles |
|---|---|---|---|---|---|---|
| 2 | AlN | copper | Ag/Cu/Ti = 80/17/3 | hydrochloric acid-hydrofluoric acid-hydrogen peroxide | 30 μm | Cracks |
| 3 | AlN | copper | Ag/Cu/Hf = 80/17/3 | hydrochloric acid-hydrofluoric acid-hydrogen peroxide | 30 μm | Cracks |
| 4 | alumina | copper | Ag/Cu/Sn/ZrH$_2$ = 80/12/5/3 | sulfuric acid-hydrofluoric acid-hydrogen peroxide | 30 μm | Cracks |
| 5 | alumina | copper | Ag/Cu/Ni/Ti = 75/15/7/3 | hydrochloric acid-hydrofluoric acid-hydrogen peroxide | 30 μm | Cracks |
| 6 | alumina | copper | Ag/Cu/In/Zn/Ti = 70/15/7/5/3 | hydrochloric acid-hydrofluoric acid-hydrogen peroxide | 30 μm | Cracks |

TABLE 5

| Comp. | Ceramic | Metal Plate | Brazing Filler Metal | Chemicals (20° C. × 45 min.) | Side Etch Amount | 300 Heat Cycles |
|---|---|---|---|---|---|---|
| 7 | AlN | copper | Ag/Cu/Ti = 80/17/3 | hydrogen peroxide-aqueous ammonia-EDTA | 50 μm | Cracks |
| 8 | AlN | copper | Ag/Cu/Ti = 90/8.5/1.5 | hydrogen peroxide-aqueous ammonia-EDTA | 70 μm | Cracks |

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic bonding substrate wherein a metal member is bonded to at least one side of a ceramic substrate via an active metal containing brazing filler metal, the method comprising the steps of:

bonding a metal member to at least one side of a ceramic substrate via an active metal containing brazing filler metal;

applying a resist on a predetermined portion of a surface of the metal member to etch a part of the metal member, and removing the resist from the metal member;

etching a part of a metal layer, which is mainly formed of a metal other than an active metal of the active metal containing brazing filler metal, with a first chemical after the resist is removed from the metal member; and selectively etching a part of an active metal layer, which is formed of the active metal and a compound thereof, with a second chemical, which is different from the first chemical, after the part of the metal layer is etched with the first chemical, the second chemical being capable of inhibiting the metal member and the metal layer from being etched and of selectively etching the active metal layer.

2. A method for producing a metal/ceramic bonding substrate as set forth in claim 1, which further comprises a step of forming a fillet on a peripheral portion of said metal circuit by chemically polishing said metal circuit after selectively etching the part of said active metal layer of said active metal containing brazing filler metal.

3. A method for producing a metal/ceramic bonding substrate as set forth in claim 2, wherein said fillet has a width of 30 μm or more.

4. A method for producing a metal/ceramic bonding substrate as set forth in claim 1, wherein said active metal containing brazing filler metal is arranged in a region which includes a metal circuit forming region for forming said metal circuit on said ceramic substrate and which is wider than the metal circuit forming region.

5. A method for producing a metal/ceramic bonding substrate as set forth in claim 1, wherein said metal other than said active metal of said active metal containing brazing filler metal is at least one kind of metal selected from the group consisting of silver, copper, nickel, tin, zinc and indium.

6. A method for producing a metal/ceramic bonding substrate as set forth in claim 1, wherein said active metal of said active metal containing brazing filler metal is at least one kind of metal selected from the group consisting of titanium, zirconium and hafnium.

7. A method for producing a metal/ceramic bonding substrate as set forth in claim 1, wherein said second chemical for selectively etching said active metal layer contains a compound forming a complex with said active metal, an oxidizer and an alkali.

8. A method for producing a metal/ceramic bonding substrate as set forth in claim 7, wherein said alkali is one selected from the group consisting of ammonia, sodium hydroxide and potassium hydroxide, or a material being alkaline when it is dissolved in water.

9. A method for producing a metal/ceramic bonding substrate as set forth in claim 7, wherein said compound forming a complex with said active metal is an acidic compound.

10. A method for producing a metal/ceramic bonding substrate as set forth in claim 9, wherein said acidic compound is a carboxylic acid type compound.

11. A method for producing a metal/ceramic bonding substrate as set forth in claim 9, wherein said acidic compound is one selected from the group consisting of citric acid, diethylenetriaminepentaacetic acid (DTPA), ethylenediaminetetraacetic acid (EDTA), hydroxyethylethylenediaminetriacetic acid (HEDTA), 1,3-propanediaminetriacetic acid (1,3PDTA), nitrilotriacetic acid (NTA) and hydroxyethylidenediphosphoric acid (HEDT).

12. A method for producing a metal/ceramic bonding substrate as set forth in claim 7, wherein said oxidizer is one selected from the group consisting of hydrogen peroxide, potassium dichromate and potassium permanganate.

13. A method for producing a metal/ceramic bonding substrate as set forth in claim 1, wherein said chemical for selectively etching said active metal layer contains a compound forming a complex with said active metal, an oxidizer and an acid.

14. A method for producing a metal/ceramic bonding substrate as set forth in claim 13, wherein said acid is one selected from the group consisting of hydrochloric acid, sulfuric acid and nitric acid.

15. A method for producing a metal/ceramic bonding substrate as set forth in claim 13, wherein said compound forming a complex with said active metal is an alkaline compound.

16. A method for producing a metal/ceramic bonding substrate as set forth in claim 15, wherein said alkaline compound is a compound having at least one amino group in its molecule.

17. A method for producing a metal/ceramic bonding substrate as set forth in claim 15, wherein said alkaline compound is ethylenediamine.

18. A method for producing a metal/ceramic bonding substrate as set forth in claim 13, wherein said oxidizer is one selected from the group consisting of hydrogen peroxide, potassium dichromate and potassium permanganate.

19. A method for producing a metal/ceramic bonding substrate as set forth in claim 1, wherein agitation is carried out at the step of selectively etching said part of said active metal layer of said active metal containing brazing filler metal.

20. A method for producing a metal/ceramic bonding substrate as set forth in claim 19, wherein said agitation is one selected from the group consisting of oscillation, convection of liquid, bubbling, and application of ultrasonic wave.

21. A method for producing a metal/ceramic bonding substrate as set forth in claim 1, wherein all or part of a surface of said metal circuit is plated with nickel or a nickel alloy.

* * * * *